United States Patent
Niehoff

(10) Patent No.: US 7,355,679 B2
(45) Date of Patent: Apr. 8, 2008

(54) LITHOGRAPHY ARRANGEMENT AND PROCEDURE THAT PRODUCES A LITHOGRAPHY

(75) Inventor: Martin Niehoff, Munich (DE)

(73) Assignee: Infineon Technologies AG, Munich (DE)

( * ) Notice: Subject to any disclaimer, the term of this patent is extended or adjusted under 35 U.S.C. 154(b) by 57 days.

(21) Appl. No.: 11/195,374

(22) Filed: Aug. 1, 2005

(65) Prior Publication Data

US 2006/0170900 A1    Aug. 3, 2006

(30) Foreign Application Priority Data

Aug. 2, 2004 (DE) .................. 10 2004 037 346

(51) Int. Cl.
G03B 27/72 (2006.01)
G03B 27/42 (2006.01)
G03B 27/54 (2006.01)
G03B 27/32 (2006.01)
G02B 5/30 (2006.01)

(52) U.S. Cl. .................. 355/71; 355/53; 355/67; 355/77; 359/483

(58) Field of Classification Search .......... 355/53, 355/71, 69, 67; 359/301, 303, 352, 362, 359/384–386, 437, 358, 361, 483, 484, 485, 359/486
See application file for complete search history.

(56) References Cited

U.S. PATENT DOCUMENTS

| | | | |
|---|---|---|---|
| 5,365,371 A * | 11/1994 | Kamon | 359/483 |
| 5,473,465 A * | 12/1995 | Ye | 359/246 |
| 6,310,679 B1 | 10/2001 | Shiraishi | |
| 6,456,359 B1 * | 9/2002 | Nishikawa et al. | 355/43 |
| 6,483,573 B1 * | 11/2002 | Schuster | 355/71 |
| 2001/0019404 A1 * | 9/2001 | Schuster et al. | 355/67 |
| 2002/0176166 A1 * | 11/2002 | Schuster | 359/494 |
| 2002/0186462 A1 * | 12/2002 | Gerhard | 359/362 |
| 2004/0119954 A1 | 6/2004 | Kawashima et al. | |
| 2004/0169924 A1 * | 9/2004 | Flagello et al. | 359/486 |
| 2004/0257553 A1 * | 12/2004 | Totzeck | 355/67 |

FOREIGN PATENT DOCUMENTS

DE    101 24 566 A1    11/2002
JP    07130606 A    5/1995

* cited by examiner

Primary Examiner—Alan Mathews
(74) Attorney, Agent, or Firm—Brinks Hofer Gilson & Lione

(57) ABSTRACT

A lithography arrangement and lithographic method is described which permits exposure of a substrate with radiation simultaneously with good intensity and contrast. A means for generating electromagnetic radiation and for directing the electromagnetic radiation onto a mask is provided. The mask has structures that essentially run along a predeterminable course direction on the mask. The electromagnetic radiation is at least partially TM-polarized relative to the course direction, so that the TM-polarized electromagnetic radiation has a polarization direction at an angle of 90° with respect to the course direction. A receptacle device for receiving a substrate to be exposed is positioned so that the radiation impinges on the substrate. A means for rotating the polarization direction of the TM-polarized electromagnetic radiation transmitted through the mask is arranged between the mask and the receptacle device to form TE-polarized electromagnetic radiation.

20 Claims, 3 Drawing Sheets

US 7,355,679 B2

LITHOGRAPHY ARRANGEMENT AND PROCEDURE THAT PRODUCES A LITHOGRAPHY

PRIORITY CLAIM

This application claims the benefit of priority to German Patent Application 10 2004 037 346.9 filed on Aug. 2, 2004, herein incorporated by reference in its entirety.

TECHNICAL FIELD

The invention relates to a lithography arrangement and a method for producing a lithography arrangement.

BACKGROUND

Photolithography is a lithographic reproduction method in which patterns are applied on materials by means of exposure to radiation. Photolithography is typically used in printing technology and in semiconductor technology.

In semiconductor technology, photolithography is used to transfer structure information from a mask into a photoresist on a semiconductor substrate (for example a silicon wafer). After development of the latent image, the structure information can be transferred, for example by means of etching, into a layer of the semiconductor substrate that is arranged beneath the photoresist. The photoresist is then removed.

The repetition of this process sequence with different successive layers and precise alignment of the individual patterns with respect to one another is a technique used in the production of integrated circuits, so-called microchips.

In optical lithography, the image of a reticle (mask) is formed on a wafer using visible light by means of the interference of diffraction orders that are generated by the reticle pattern and are imaged by means of a lens. In accordance with the prior art, unpolarized light is generally used for photolithographic applications. The resolution capability of an optical imaging system is described by the so-called NA value (numerical aperture), the NA value of known imaging lenses typically lying in the range of between 0.8 and 0.85. In order to achieve better resolutions, higher NA values are sought, which leads to a higher angular range of electromagnetic radiation that is incident on the wafer.

For small structure dimensions of objects on a reticle which are intended to be imaged on a semiconductor wafer, this results in high angles of the diffraction orders which have to be imaged by a lens of the lithography system. These high angles have the effect that different components of electromagnetic radiation radiated in with different polarization directions (for example referred to as TE-polarized component, "transverse electric", and as TM-polarized component, "transverse magnetic") form a different contrast on the plane of the wafer. TM-polarized light forms a poor contrast at high angles. In order to avoid TM polarization, it has been proposed that only TE-polarized light could be used for exposure.

However, for small structure dimensions, that is to say for small pitches to be imaged, the reticle itself functions as a polarizer that preferably transmits TM-polarized light without transmission losses, whereas high transmission losses occur in the case of TE-polarized light. As a result, the intensity of the TE-polarized light is reduced, which light generates better images on the wafer than the TM-polarized light that is transmitted essentially in an unattenuated manner.

In known lithography arrangements, particularly for small structure dimensions, these effects lead to quality problems in the imaging of structures from a reticle onto a wafer and may adversely influence the functionality of integrated circuits on the wafer.

DE 101 24 566 A1 describes an optical imaging system comprising polarization means, which has a polarization rotating element for rotating radial polarization into tangential polarization, the polarization rotating element being arranged at a predeterminable location in the region from the imaging-functional optical components following the radial polarization generating means.

U.S. Pat. No. 6,310,679 B1 describes a projection exposure arrangement, in which a device for rotating the polarization direction is arranged between the mask and the substrate, the polarization being rotated with the objective of achieving an increase in the depth of focus.

US 2004/0119954 A1 discloses an immersion exposure arrangement, in which a recurring pattern formed on a mask is imaged onto an object by means of an optical exposure system in such a way that the light used for imaging is exclusively s-polarized in a predetermined range of the angle of incidence.

SUMMARY

A lithography arrangement and a method for producing a lithography arrangement are presented which, even for small dimensions of objects to be imaged, enable an exposure of a substrate with sufficiently intensive radiation and simultaneously with sufficiently good contrast.

The lithography arrangement according to one embodiment of the invention contains a mask. Furthermore, the lithography arrangement contains a receptacle device for receiving a substrate to be exposed, and a means for rotating the polarization direction of at least partially polarized electromagnetic radiation transmitted through the mask. The means is arranged between the mask and the receptacle device.

In the method according to the invention for producing a lithography arrangement, a mask and a receptacle device for receiving a substrate to be exposed are provided. Furthermore, a means for rotating the polarization direction of at least partially polarized magnetic radiation transmitted through the mask is provided. The means is arranged between the mask and the receptacle device.

In the lithography arrangement, the polarization direction of the electromagnetic radiation (for example of light in an optical lithography arrangement) is altered after the light has passed through a mask (reticle). As a result, it is possible to direct onto the mask light having a polarization direction such that the polarized light passes through transparent regions of the mask essentially in an unattenuated manner. After passing through the mask, the polarization direction of the electromagnetic radiation is rotated in such a way that the imaging of the reticle pattern on a substrate onto which the electromagnetic radiation is directed has a good contrast. As a result, the polarization scheme is clearly optimized for electromagnetic radiation for passing through a reticle and for generating an image on a substrate.

Consequently, an optical element is provided between the mask and the receptacle device for a substrate. The optical element rotates the polarization direction of at least partially linearly polarized electromagnetic radiation by a predeterminable angle.

By way of example, a reticle is illuminated with TM-polarized light (which results in a high light intensity when impinging on a substrate), after passing through the reticle the polarization of the light is rotated by 90°, so that TE-polarized light is obtained, which can be used (in order to obtain a good contrast) to expose a photoresist on a substrate.

As a result, it is possible to use TM-polarized light, for example, in order to illuminate the mask, as a result of which (particularly for small feature dimensions) transmission losses that occur in the case of TE-polarized light when passing through the mask are avoided or reduced. The consequence of this is that the illumination intensity is also high on a substrate. Once the light has been transmitted through the reticle, the preferred direction of polarization of the light is altered from TE polarization to TM polarization (for example using two $\lambda/4$ plates and a mirror) in order to achieve an optimized image contrast on the plane of the wafer. Such an optical element may be arranged at any desired location of the optical system between the rear side of the reticle and the wafer, wherever the arrangement of such an optical element is advantageous in the context of a respective application.

The foregoing summary has been provided only by way of introduction. Nothing in this section should be taken as a limitation on the following claims, which define the scope of the invention.

BRIEF DESCRIPTION OF THE FIGURES

Exemplary embodiments of the invention are illustrated in the figures and are explained in more detail below.

In the figures.

Identical or similar components in different figures are provided with identical reference numerals.

Figure 1:
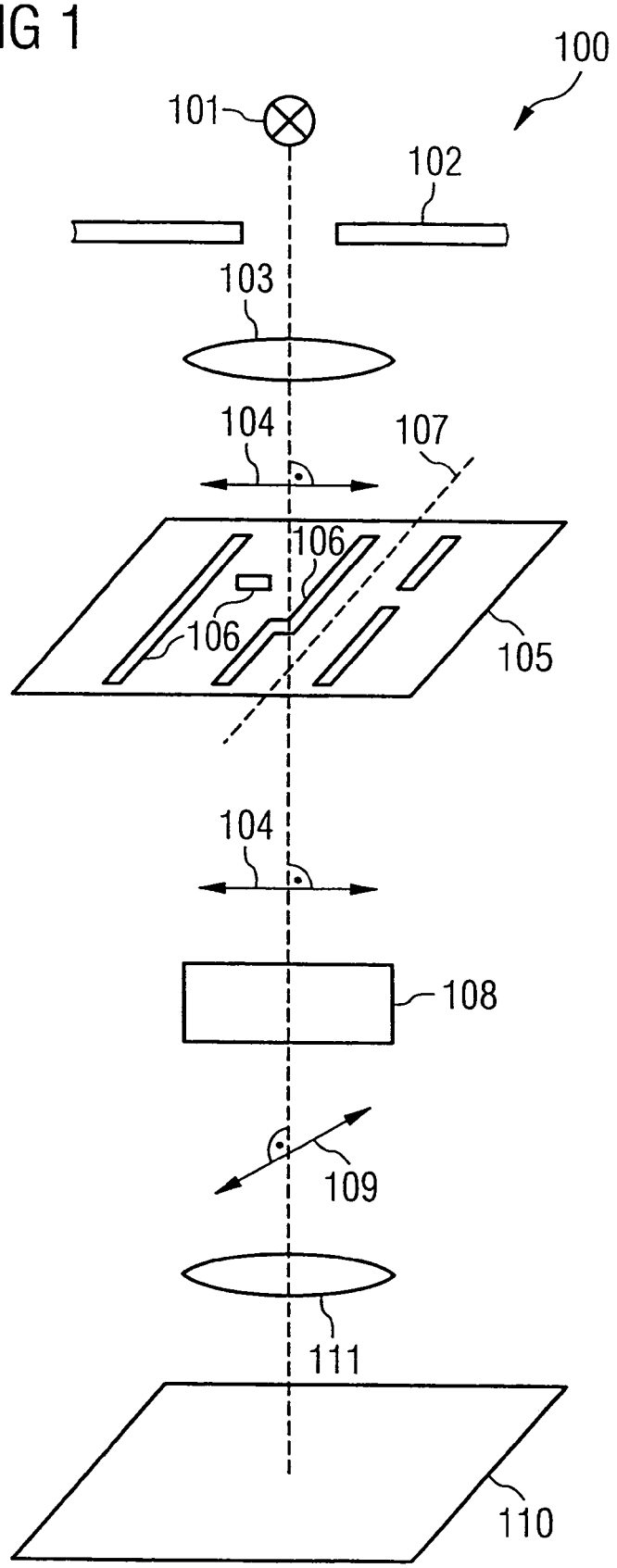
FIG. 1 shows a lithography arrangement in accordance with an exemplary embodiment of the invention.

The illustrations in the figures are schematic and not to scale.

DETAILED DESCRIPTION

The principles above are explained in detail once again below.

Firstly, polarization effects and the compensation thereof in the plane of a reticle are considered.

Electromagnetic radiation is used for imaging a pattern from a reticle onto a substrate. If feature dimensions in the plane of the reticle attain the order of magnitude of the wavelength of the electromagnetic radiation (for example light) used, dense to semi-dense lines (or other structures) on the reticle function as a polarizer for the illuminating electromagnetic radiation. Incoming TE-polarized light (that is to say the light component having a polarization direction parallel to structures on the reticle) is attenuated on account of this effect, whereas TM-polarized light (that is to say the light component having a polarization direction perpendicular to the structures on the reticle) is essentially transmitted completely. In relation to the reticle, using TM-polarized light for illumination may achieve a maximum intensity of electromagnetic radiation which is transmitted through the reticle.

Polarization effects and the compensation thereof on the plane of a wafer, that is to say on the plane of the substrate to be patterned, are described below.

On the plane of the wafer, smaller feature dimensions mean higher angles of incidence (higher values of the numerical aperture NA) for the wavefronts that generate the image. For higher angles of incidence, for TE-polarized electromagnetic radiation, the electric field vector (E-field vector) is clearly oriented in the same direction for both interfering refraction orders. As a result, TE-polarized light does not suffer any impairment of contrast. On the other hand, TM-polarized light clearly sees an increased angle of the electric field vector between the two refraction orders. This results in an impaired contrast of TM-polarized light, possibly even a contrast reversal. In relation to the plane of the wafer, therefore, use of only TE-polarized light for illumination may obtain a good contrast.

The opposite requirements made of the polarization directions of light at the reticle plane and at the wafer plane may be simultaneously fulfilled. In this case, an optimum transmittance in the reticle plane by virtue of using preferably TM-polarized light for irradiating the reticle may be achieved. TE-polarized light is then used for an optimum contrast on the wafer plane. A good contrast may be achieved for small feature dimensions. An illuminator that generates TM-polarized light, for example, which is directed onto the mask may be used. An optical element is arranged at any desired location downstream of the mask plane and upstream of the wafer plane, which optical element rotates the polarization direction of the light preferably by 90°, as a result of which TE polarized light is formed from the TM polarized light.

This results in a low attenuation of the electromagnetic radiation when passing through the mask and simultaneously a good contrast on the wafer to be patterned.

It should be noted that the dependence of the intensity of the electromagnetic radiation transmitted through a reticle on the polarization direction of the electromagnetic radiation used is particularly large when the features or the structures to be imaged on the reticle have a preferred direction, since it is then possible to benefit from a type of "antenna" effect. That is to say that structures having a preferred direction of extent absorb only weakly when the oscillation direction of the light is oriented perpendicularly to the course direction, whereas the structures clearly function as antennas which absorb light well if the oscillation direction of the light is oriented parallel to the course direction. Such a preferred direction of structures exist in many structures which are used for forming integrated circuits, at least in large partial regions or locally (for example interconnects of a memory cell array such as, for example, of a DRAM memory, wiring planes, etc.). The tuning of the polarization direction of the electromagnetic radiation used affords major advantages in all these cases. If this should apply only to part of an integrated circuit, then it is also possible for just this region to be exposed, whereas another region can be exposed conventionally. It is also possible to realize the method with a two-stage exposure ("double exposure"), structures having a preferred direction in accordance with the principle according to the invention being formed in a first exposure, and the rest of the structures being produced afterward.

The lithography arrangement may have a means for generating electromagnetic radiation and for directing the electromagnetic radiation onto the mask, the electromagnetic radiation being at least partially polarized (in particular at least partially linearly polarized). Such a means for generating electromagnetic radiation may be realized as a laser, for example.

In the case of the lithography arrangement, the mask may have structures which essentially run along a predeterminable course direction on the mask.

In the case of the lithography arrangement, the mask has structures which are intended to be imaged onto a wafer. These structures preferably run in accordance with a predeterminable course direction. This means that the structures predominantly contain structure components (e.g. conductor lines of an integrated circuit to be formed) which run in a specific direction. However, all structure components need not necessary run along this direction. It suffices for a predominant proportion of the structures to run along a specific direction. For exploiting the effect on which the invention is based it is ideal if the structures run completely in a specific direction, for example conductor lines running parallel to one another.

The means for generating electromagnetic radiation and for directing the electromagnetic radiation onto the mask may be set up such that the electromagnetic radiation is at least partially polarized in a polarization direction which is at an angle different than zero with respect to the course direction.

The electromagnetic radiation may be at least partially polarized in a polarization direction which is at an angle different than zero with respect to the course direction of the structures. For the effect exploited, it suffices for the electromagnetic radiation to be partially polarized, that is to say for there to be a preferred polarization direction within the individual waves or quanta of the electromagnetic radiation.

The means for generating electromagnetic radiation and for directing the electromagnetic radiation onto the mask may be set up such that the electromagnetic radiation is completely polarized in a polarization direction which is at an angle other than zero with respect to the course direction. With complete (linear) polarization of the incident electromagnetic radiation, a particularly pronounced imaging improvement effect can be achieved.

The means for generating electromagnetic radiation and for directing the electromagnetic radiation onto the mask may be set up such that the electromagnetic radiation is at least partially polarized in a polarization direction which is at an angle of 90° with respect to the course direction.

In the case of an orthogonal orientation between course direction and polarization direction, the intensity of the electromagnetic radiation transmitted through the mask is particularly great.

The means for generating electromagnetic radiation and for directing the electromagnetic radiation onto the mask may be set up such that the electromagnetic radiation is at least partially polarized in a polarization direction which lies in the plane of the mask. To put it another way, the oscillation plane of the electromagnetic field vector may lie in the mask plane and perpendicular to the direction of propagation of the electromagnetic radiation. The mask is formed by a two-dimensional structure that is defined by the course direction and a direction orthogonal thereto.

The means of rotating the polarization direction of electromagnetic radiation transmitted through the mask may be set up such that it rotates the polarization direction by 90°. A particularly effective combination of high light intensity and good contrast can be achieved in this case.

The means for rotating the polarization direction of the electromagnetic radiation transmitted through the mask may be set up so that it rotates the polarization direction such that the rotated polarization direction lies in the plane of the mask.

The means for rotating the polarization direction of the electromagnetic radiation transmitted through the mask may have a $\lambda/4$ plate and a reflection mirror. $\lambda$ designates the wavelength of the electromagnetic radiation. Thus, it is possible for example to guide TM-polarized light through the $\lambda/4$ plate, whereby circularly polarized light is obtained. After reflection of the circularly polarized light at the reflection mirror, the light once again passes through the $\lambda/4$ plate, as a result of which TE-polarized light is generated.

As an alternative, the means for rotating the polarization direction of the electromagnetic radiation transmitted through the mask may have a first $\lambda/4$ plate and a second $\lambda/4$ plate. An optical element having two $\lambda/4$ plates of this type can realize the rotation of the polarization direction by 90°.

The means for rotating the polarization direction may also comprise liquid crystal molecules, which likewise have the property of rotating the polarization direction of electromagnetic radiation, in particular of light.

The lithography arrangement may have a substrate, which is received by the receptacle device, and which is arranged such that electromagnetic radiation coming from the means for rotating the polarization direction is incident on the substrate. The substrate may be a semiconductor wafer (for example a silicon wafer or a silicon chip).

A photoresist layer may be formed on the semiconductor wafer, which photoresist layer is to be patterned by means of the electromagnetic radiation incident thereon in combination with an etching method.

The lithography arrangement may be set up as visible light radiation lithography arrangement (that is to say using electromagnetic radiation in the visible region), as ultraviolet radiation lithography arrangement (that is to say using electromagnetic radiation in the UV region), whereas X-ray lithography arrangement (that is to say as a lithography arrangement that operates with X-ray radiation).

A description is given below, referring to FIG. 1, of a lithography arrangement 100 in accordance with a preferred exemplary embodiment of the invention.

The lithography arrangement 100 shown in FIG. 1 contains an electromagnetic radiation source 101, for example an ArF radiation source, which emits electromagnetic radiation having a wavelength of 193 nm. The light emitted by the electromagnetic radiation source 101 is linearly polarized and has a polarization vector 104. The electromagnetic radiation generated is directed through a diaphragm 102 and through a lens 103 onto a mask 105 (reticle).

The mask 105 contains a multiplicity of structures 106 which are intended to be imaged on a silicon wafer 110. The structures 106 comprise different components which, however, are essentially arranged along a course direction 107. The electromagnetic radiation is absorbed by the structures 106 and passes through regions between the structures 106. The first polarization vector 104 is essentially oriented orthogonally with respect to the course direction 107. After passing through the mask 105, the electromagnetic radiation has the polarization direction in accordance with the first polarization vector 104 in an unchanged manner. After passing through the mask 105, the electromagnetic radiation is led through a phase shifter 108, which may be formed from two $\lambda/4$ plates, for example, and which is set up in such a way that it rotates the polarization direction of electromagnetic radiation transmitted through the mask 105 by 90°.

Therefore, the light emerging from the phase shifter 108 has a linear polarization in accordance with a second polarization vector 109, which is perpendicular to the direction of propagation of the electromagnetic radiation and perpendicular to the first polarization vector 104. The light having a linear polarization in accordance with the second polarization vector 109 is transmitted through a lens 111. The light transmitted through the lens 111 impinges on the silicon wafer 110, where it generates a good contrast on account of the polarization direction 109. Additional imaging optical elements (not shown) may be provided in the lithography arrangement 100, in particular between the phase shifter 108 and the silicon wafer 110.

The orientation of the first polarization vector 104 has the effect that the electromagnetic radiation is transmitted essentially in an unattenuated manner in regions of the mask 105 which are free of structures 106. On account of the phase shift of the electromagnetic radiation which is realized by the phase shifter 108, a good contrast on the silicon wafer 110 is simultaneously made possible, even for very small structure dimensions.

A mask plane 200 is described below, referring to FIG. 2.

Figure 2:
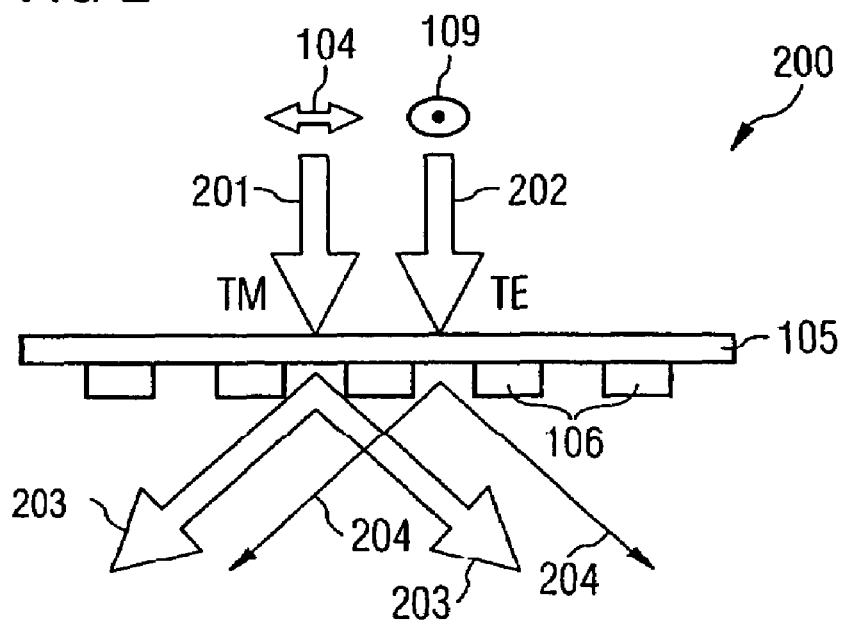
FIG. 2 shows a schematic view of the impingement of electromagnetic radiation on a reticle plane.

FIG. 2 shows an enlarged illustration of the mask 105 and of the structures 106 formed thereon. If incident TM radiation 201 with a polarization corresponding to the first polarization vector 104 from FIG. 1 impinges on the mask 105, then TM radiation 203 is transmitted in an (almost) unattenuated manner through the mask 105. If, by contrast, TE radiation 202 with a polarization corresponding to the second polarization vector 109 (perpendicular to the paper plane of FIG. 2 and in the course direction of the structures 106) impinges on the mask 105, then this electromagnetic radiation is greatly attenuated, so that only a little TE radiation 204 is transmitted through the mask 105.

Consequently, prior to passing through the mask 105, the electromagnetic radiation is polarized in such a way that it essentially oscillates along the first polarization vector 104 (that is to say is TM-polarized), so that it can then pass through the structures 106 running perpendicular to the paper plane essentially in an unattenuated manner.

A wafer plane 300 is described in more detail below, referring to FIG. 3.

Figure 3:
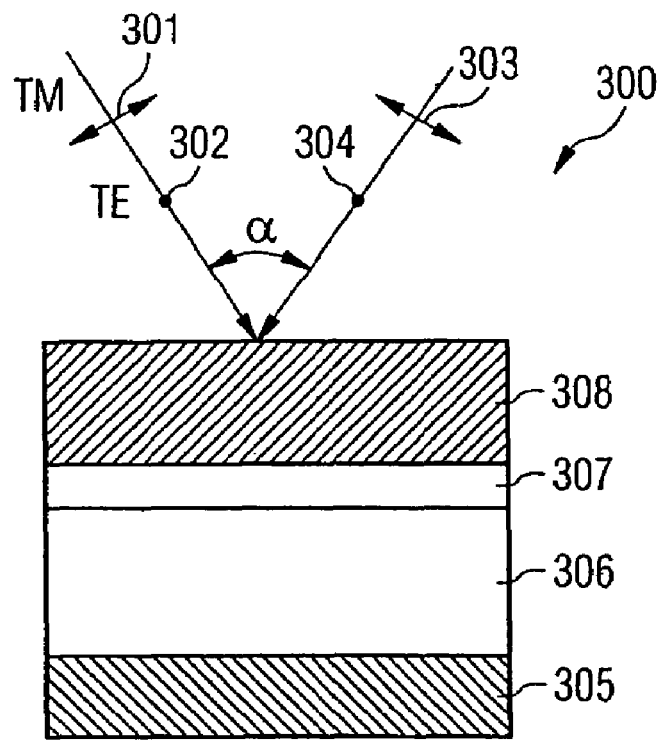
FIG. 3 shows a schematic view of the impingement of electromagnetic radiation on a wafer.

FIG. 3 shows first incident TM beams 301 and first incident TE beams 302, and also second incident TM beams 303 and second incident TE beams 304. The layer arrangement from FIG. 3 contains a silicon wafer 305, a polysilicon layer 306 arranged thereon, a BARC layer 307 ("bottom antireflective coating") arranged thereon, and a photoresist layer 308 deposited thereon. The contrast which results if TE radiation is directed onto the layer arrangement from FIG. 3 is better than the contrast when using TM radiation precisely for small structure dimensions and high angles $\alpha$. This is clearly due to the fact that, particularly for large angles $\alpha$, the vectors of the TM components always form a considerable angle, whereas the vectors of the TE components are always parallel to one another. As a result of the polarization direction being rotated according to the embodiment of the invention after electromagnetic TM radiation has passed through the mask 305, for the generation of TE radiation, a good contrast can be achieved in this respect in the wafer plane 300.

A description is given below, referring to FIG. 4, of the interplay of contrast, angle of incidence and polarization direction of electromagnetic radiation in the wafer plane 300.

An angle $\theta_{in}$ of incidence is plotted along an abscissa 401 of the diagram 400. A contrast is plotted along an ordinate 402 of the diagram 400. A first curve profile 403 shows the dependence for TE-polarized light, a second curve 404 shows the dependence for TM-polarized light and a third curve 405 shows the dependence for unpolarized light.

Figure 4:
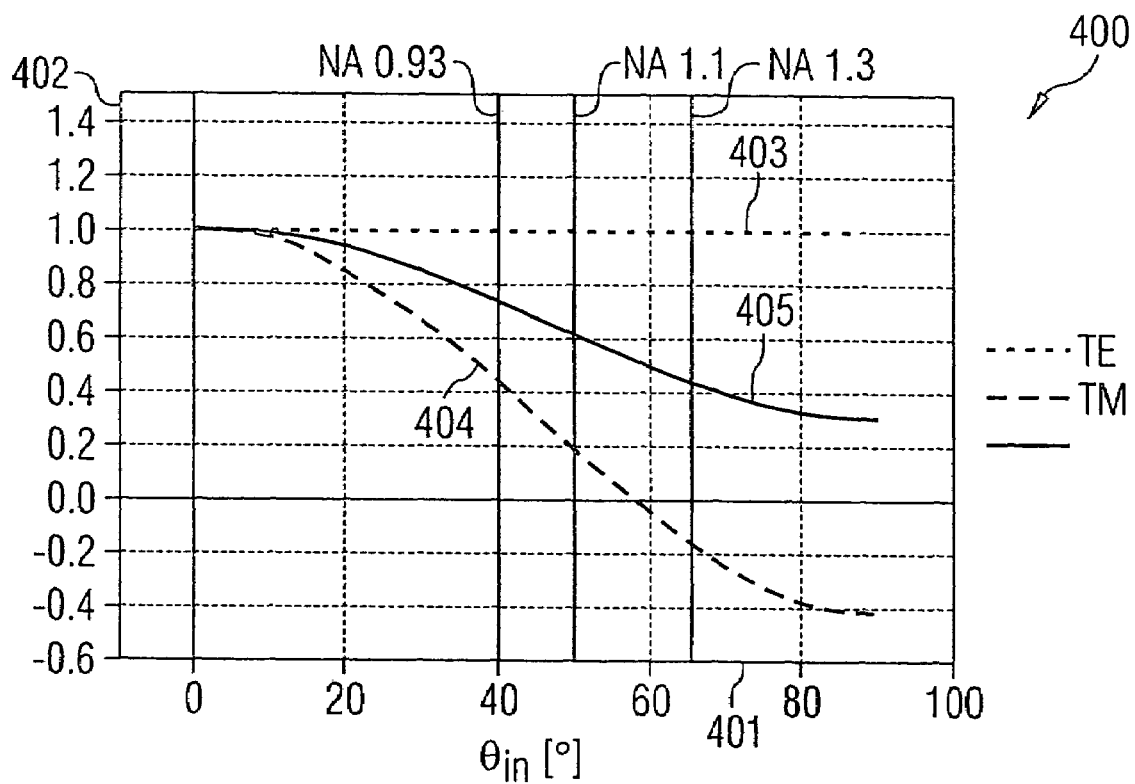
FIG. 4 shows the dependence of the contrast on the angle of incidence for differently polarized electromagnetic radiation.

As can be seen from FIG. 4, a high contrast can be achieved for TE-polarized light (see first curve profile 403) even for high angles $\theta_{in}$ of incidence, whereas an impaired contrast is obtained for TM-polarized light 404 for a high angle $\theta_{in}$ of incidence.

A description is given below, referring to FIG. 5, of an exemplary realization of a polarization rotating device 500 of a lithography arrangement in accordance with an exemplary embodiment of the invention.

Figure 5:
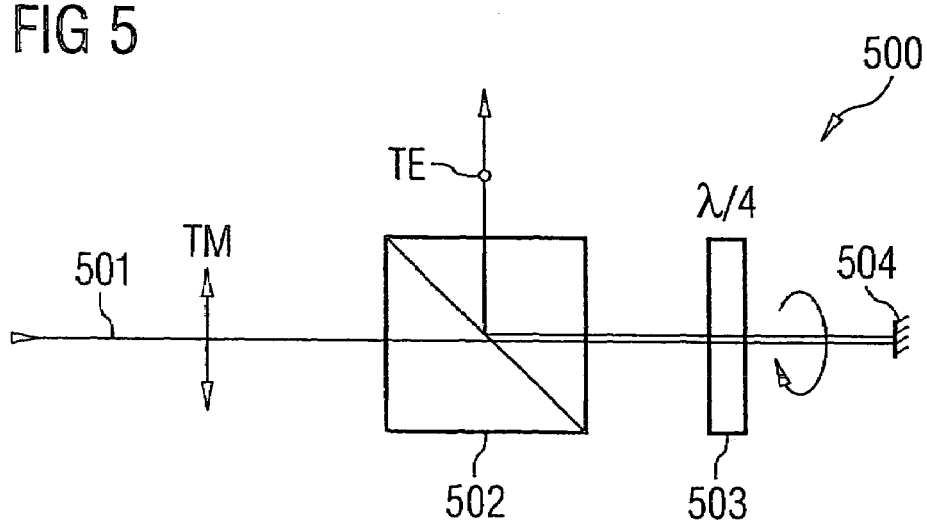
FIG. 5 shows a schematic view of an exemplary realization of a polarization rotating device of a lithography arrangement in accordance with an exemplary embodiment of the invention.

FIG. 5 shows a light beam 501 that is TM-polarized and has already passed through a reticle (not shown). The light beam 501 passes through an (optional) beam splitter 502 and through a $\lambda/4$ plate 503, where the polarization direction is altered from linear TM polarization to circular polarization. The circularly polarized light is reflected at a reflection mirror 504 and again passes through the $\lambda/4$ plate 503. After passing through the $\lambda/4$ plate 503 the second time, the circularly polarized light is converted into TE linearly polarized light, which can then be directed onto a wafer (not shown) in order to obtain a good contrast.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A lithography arrangement comprising:
   a mask having structures, which run along a predeterminable course direction on the mask;
   a means for generating electromagnetic radiation and for directing the electromagnetic radiation onto the mask, the electromagnetic radiation being at least partially TM-polarized relative to the course direction, so that the TM-polarized electromagnetic radiation has a polarization direction at an angle of 90° with respect to the course direction;
   a means for rotating the polarization direction of at least partially TM-polarized electromagnetic radiation.

2. The lithography arrangement as claimed in claim 1, in which the means for generating electromagnetic radiation and for directing the electromagnetic radiation onto the mask is set up in such a way that the electromagnetic radiation is at least partially polarized in a polarization direction which lies in the plane of the mask.

3. The lithography arrangement as claimed in claim 1, in which the means for rotating the polarization direction of the electromagnetic radiation transmitted through the mask rotates the polarization direction such that the rotated polarization direction lies in the plane of the mask.

4. The lithography arrangement as claimed in claim 1, in which the means for rotating the polarization direction of the electromagnetic radiation transmitted through the mask has a $\lambda/4$ plate and a reflection mirror.

5. The lithography arrangement as claimed in claim 1, in which the means for rotating the polarization direction of the electromagnetic radiation transmitted through the mask has a first a$\lambda/4$ plate and a second a$\lambda/4$ plate.

6. The lithography arrangement as claimed in claim 1, further comprising a substrate, the substrate is arranged such that electromagnetic radiation coming from the means for rotating the polarization direction is incident on the substrate.

7. The lithography arrangement as claimed in claim 6, in which the substrate is a semiconductor wafer.

8. The lithography arrangement as claimed in claim 7, in which a photoresist layer is formed on the semiconductor wafer.

9. The lithography arrangement as claimed in claim 1, wherein the means for generating electromagnetic radiation and for directing the electromagnetic radiation onto the mask comprises means for generating visible radiation, ultraviolet radiation, or X-ray radiation.

10. A method for producing a lithography arrangement, comprising:

providing the lithography arrangement of claim 1;
providing a substrate; and
exposing the substrate.

11. The method of claim 10, further comprising exposing only part of an integrated circuit using the lithography arrangement and exposing another region conventionally.

12. The method of claim 10, further comprising a two-stage exposure in which structures of an integrated circuit have a preferred direction are formed in a first exposure, and the remainder of the structures of the integrated circuit being exposed in a second exposure.

13. A method for producing a lithography arrangement comprising:

providing a mask having structures that essentially run along a predeterminable course direction on the mask;
providing a means for generating electromagnetic radiation and for directing the electromagnetic radiation onto the mask, the electromagnetic radiation being at least partially TM-polarized relative to the course direction, so that the TM-polarized electromagnetic radiation has a polarization direction at an angle of 90° with respect to the course direction;
providing a means for rotating the polarization direction of the at least partially TM-polarized electromagnetic radiation transmitted through the mask to form TE-polarized electromagnetic radiation.

14. A lithography arrangement comprising:

a mask having structures that essentially run along a predeterminable course direction on the mask;
an electromagnetic radiation source radiating electromagnetic radiation which is at least partially TM-polarized relative to the course direction, so that the TM-polarized electromagnetic radiation has a polarization direction at an angle of 90° with respect to the course direction;
a phase shifter that rotates the polarization direction of the at least partially TM-polarized electromagnetic radiation transmitted through the mask to form TE-polarized electromagnetic radiation.

15. The lithography arrangement as claimed in claim 14, wherein the electromagnetic radiation is at least partially polarized in a polarization direction which lies in the plane of the mask.

16. The lithography arrangement as claimed in claim 14, wherein the phase shifter rotates the polarization direction such that the rotated polarization direction lies in the plane of the mask.

17. The lithography arrangement as claimed in claim 14, wherein the phase shifter comprises a $a\lambda/4$ plate and a reflection mirror.

18. The lithography arrangement as claimed in claim 14, wherein the phase shifter comprises a $a\lambda/4$ plate and a second $a\lambda/4$ plate.

19. The lithography arrangement as claimed in claim 14, wherein the electromagnetic radiation source comprises a visible radiation, ultraviolet radiation, or X-ray radiation generator.

20. The lithography arrangement as claimed in claim 14, further comprising a first lens and a diaphragm disposed between the electromagnetic radiation source and the mask, and a second lens disposed between the phase shifter and the receptacle.

* * * * *